(12) United States Patent
Lee et al.

(10) Patent No.: US 8,785,103 B2
(45) Date of Patent: Jul. 22, 2014

(54) PHOTOSENSITIVE NOVOLAC RESIN, POSITIVE PHOTOSENSITIVE RESIN COMPOSITION INCLUDING SAME, PHOTOSENSITIVE RESIN FILM PREPARED BY USING THE SAME, AND SEMICONDUCTOR DEVICE INCLUDING THE PHOTOSENSITIVE RESIN FILM

(75) Inventors: Jong-Hwa Lee, Uiwang-si (KR); Hyun-Yong Cho, Uiwang-si (KR); Min-Kook Chung, Uiwang-si (KR); Ji-Young Jeong, Uiwang-si (KR); Myoung-Hwan Cha, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 0 days.

(21) Appl. No.: 13/590,440

(22) Filed: Aug. 21, 2012

(65) Prior Publication Data
US 2013/0171563 A1 Jul. 4, 2013

(30) Foreign Application Priority Data
Dec. 29, 2011 (KR) .................. 10-2011-0146190

(51) Int. Cl.
G03F 7/023 (2006.01)
(52) U.S. Cl.
CPC .................. G03F 7/0233 (2013.01)
USPC ............ 430/190; 430/18; 430/165; 430/191; 430/192; 430/193
(58) Field of Classification Search
CPC ................. G03F 7/0236; G03F 7/0233
USPC ................. 430/18, 165, 191, 192, 193, 190
See application file for complete search history.

(56) References Cited

U.S. PATENT DOCUMENTS

| | | | |
|---|---|---|---|
| 2,772,975 A | 12/1956 | Rickers | |
| 2,797,213 A | 6/1957 | Moore et al. | |
| 3,669,658 A | 6/1972 | Yonezawa et al. | |
| 5,114,826 A | 5/1992 | Kwong et al. | |
| 5,153,096 A | 10/1992 | Uenishi et al. | |
| 5,376,499 A | 12/1994 | Hammerschmidt et al. | |
| 5,449,584 A | 9/1995 | Banba et al. | |
| 5,478,691 A * | 12/1995 | Miyashita et al. | 430/190 |
| 5,486,447 A | 1/1996 | Hammerschmidt et al. | |
| 6,001,517 A | 12/1999 | Kawamonzen | |
| 6,207,356 B1 | 3/2001 | Banba et al. | |
| 6,376,151 B1 | 4/2002 | Takahashi et al. | |
| 6,790,582 B1 * | 9/2004 | Eilbeck | 430/190 |
| 6,929,891 B2 | 8/2005 | Rushkin et al. | |
| 7,056,641 B2 | 6/2006 | Naiini et al. | |
| 7,361,445 B2 * | 4/2008 | Banba et al. | 430/191 |
| 7,435,525 B2 | 10/2008 | Hattori et al. | |
| 7,674,566 B2 | 3/2010 | Shibui | |
| 8,198,002 B2 | 6/2012 | Jung et al. | |
| 8,420,287 B2 | 4/2013 | Jeong et al. | |

| | | | |
|---|---|---|---|
| 2004/0142275 A1 | 7/2004 | Komatsu | |
| 2004/0229167 A1 | 11/2004 | Naiini et al. | |
| 2013/0137036 A1 * | 5/2013 | Jeong et al. | 430/283.1 |

FOREIGN PATENT DOCUMENTS

| | | |
|---|---|---|
| EP | 0695740 A1 | 2/1996 |
| JP | 63-096162 A | 4/1988 |
| JP | 01-189644 A | 7/1989 |
| JP | 07-175214 A | 7/1995 |
| JP | 09-302221 A | 11/1997 |
| JP | 10-307393 A | 11/1998 |
| JP | 11-202488 A | 7/1999 |
| JP | 2000-292913 A | 10/2000 |
| JP | 2002-241611 A | 8/2002 |
| JP | 2004-132996 A | 4/2004 |
| JP | 2005-338481 A | 12/2005 |
| JP | 2009-057458 A | 3/2009 |

(Continued)

OTHER PUBLICATIONS

Search Report in counterpart Taiwanese Application No. 101130125 dated Mar. 19, 2014, pp. 1.

(Continued)

*Primary Examiner* — John Chu
(74) *Attorney, Agent, or Firm* — Additon, Higgins, Pendleton & Ashe, P.A.

(57) ABSTRACT

Disclosed is a photosensitive novolac resin including a structural unit represented by the following Chemical Formula 1 and structural unit represented by the following Chemical Formula 2, wherein $R^{11}$, $R^{12}$, $R^{13}$, and $R^{14}$ in Chemical Formulae 1 and 2 are the same as defined in the detailed description, a positive photosensitive resin composition including the same, a photosensitive resin film fabricated using the same, and a semiconductor device including the photosensitive resin composition.

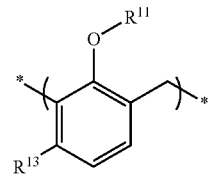

[Chemical Formula 1]

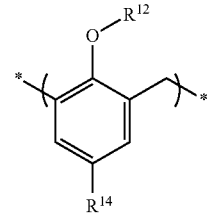

[Chemical Formula 2]

8 Claims, 3 Drawing Sheets

(56) References Cited

FOREIGN PATENT DOCUMENTS

| | | |
|---|---|---|
| JP | 2009-108074 A | 5/2009 |
| JP | 2009-282084 A | 12/2009 |
| KR | 1994-0005614 | 6/1994 |
| KR | 1994-0011202 | 11/1994 |
| KR | 10-1996-0007553 | 3/1996 |
| KR | 10-2003-0018153 A | 3/2003 |
| KR | 10-2006-0085629 A | 7/2006 |
| KR | 10-2009-0056737 A | 6/2009 |

OTHER PUBLICATIONS

English-translation of Search Report in counterpart Taiwanese Application No. 101130125 dated Mar. 19, 2014, pp. 1.

* cited by examiner

PHOTOSENSITIVE NOVOLAC RESIN, POSITIVE PHOTOSENSITIVE RESIN COMPOSITION INCLUDING SAME, PHOTOSENSITIVE RESIN FILM PREPARED BY USING THE SAME, AND SEMICONDUCTOR DEVICE INCLUDING THE PHOTOSENSITIVE RESIN FILM

CROSS-REFERENCE TO RELATED APPLICATIONS

This application claims priority to and the benefit of Korean Patent Application No. 10-2011-0146190 filed in the Korean Intellectual Property Office on Dec. 29, 2011, the entire disclosure of which is incorporated herein by reference.

FIELD

This disclosure relates a photosensitive novolac resin, a positive photosensitive resin composition including the same, a photosensitive resin film fabricated using the same, and a semiconductor device including the photosensitive resin composition.

BACKGROUND

Conventional surface protective layers and interlayer insulating layers for semiconductor devices include a polyimide resin, which can have excellent heat resistance, electrical characteristics, mechanical characteristics, and the like. The polyimide resin has recently been used as a photosensitive polyimide precursor composition which can be coated easily. The photosensitive polyimide precursor composition is coated on a semiconductor device, patterned by ultraviolet (UV) rays, developed, and heat imidized to provide a surface protective layer, an interlayer insulating layer, and the like. Accordingly, it is possible to significantly shorten the processing time compared with that of a conventional non-photosensitive polyimide precursor composition.

The photosensitive polyimide precursor composition can be applied as a positive type in which an exposed part is dissolved by development, or a negative type in which the exposed part is cured and maintained. Positive type photosensitive compositions can be developed by a non-toxic alkali aqueous solution. The positive photosensitive polyimide precursor composition can include a polyimide precursor of polyamic acid, a photosensitive material of diazonaphthoquinone, and the like. However, it can be difficult to obtain the desired pattern using the positive photosensitive polyimide precursor composition because the carbonic acid of the polyamic acid can be too highly soluble in an alkali.

Japanese Patent Laid-Open Publication No. Pyeung 11-202488 is directed to a photosensitive polyimide precursor composition including a polyimide resin obtained from a dehydration reaction of an aromatic acid dianhydride having a phenolic hydroxy group with aromatic diamine and diazonaphthoquinone.

The diazonaphthoquinone reacts with a phenolic hydroxy group in the polyimide resin and can suppress the polyimide resin from being dissolved in an alkali aqueous solution. The diazonaphthoquinone can be decomposed by light and can produce a ketene group. The diazonaphthoquinone also can react with water and produce a carboxyl group. Accordingly, the photosensitive polyimide resin film may have a large dissolubility difference for an alkali aqueous solution between an exposed part and an unexposed part. As a result, when the photosensitive polyimide resin film is developed using an alkali aqueous solution, the exposed part may be removed by the alkali aqueous solution, forming a positive photosensitive polyimide resin composition pattern.

Generally, in order to form a fine pattern in a short time when an exposed photosensitive polyimide resin thin film is developed, a tetramethylammonium hydroxide (TMAH) aqueous solution is used. The alkali concentration of a TMAH aqueous solution, however, can be hard to control and the TMAH aqueous solution is not necessarily safe for a human body.

In general, it is well known to esterify a compound having a phenolic dydroxy group with quinone diazide sulfonic acid and use the esterified compound as a photoresist in a resist composition for a fine semiconductor process. In other words, when a composition including a novolac resin and a compound having a quinone diazide group is coated on a substrate and radiated by a light with a wavelength ranging from about 300 to about 500 nm, the quinone diazide group is decomposed and produces a carboxyl group, which makes the composition soluble in alkali. Accordingly, the composition may be used as a positive resist. This positive resist can have excellent resolution compared with a negative resist and thus may be used to fabricate various kinds of integrated circuits for a semiconductor.

Recently, integrated circuits are becoming more highly integrated and thus there is a need to micronize the same and provide sub-micron patterns. In order to form the sub-micron pattern, a lithography process plays a very important role in fabricating an integrated circuit, and the positive resist is required to have improved resolution.

There are limitations to prior techniques for preparing a resist material including a quinone diazide compound and a novolac resin by combining each component. For example, U.S. Pat. No. 5,153,096 discloses a method of esterifying a triphenyl methane-based compound having at least two phenolic hydroxy groups with quinone diazide sulfonic acid to use it as a photoresist. However, the photoresist is not still satisfactory to be used for an extreme microprocess to fabricate a very large scale integrated direct circuit, what is called, for sub-micron lithography.

SUMMARY

One embodiment provides a photosensitive novolac resin which can be used in a positive photosensitive resin composition and can provide a high performance photoresist.

Another embodiment provides a positive photosensitive resin composition that can have high sensitivity and a high film residue ratio due to a photosensitive novolac resin.

Yet another embodiment provides a photosensitive resin film fabricated by using the positive photosensitive resin composition.

Still another embodiment provides a semiconductor device including the photosensitive resin film.

According to one embodiment, a photosensitive novolac resin including a structural unit represented by the following Chemical Formula 1 and a structural unit represented by the following Chemical Formula 2 is provided.

[Chemical Formula 1]

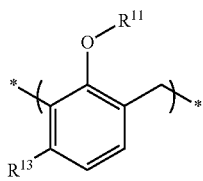

[Chemical Formula 2]

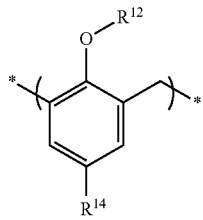

In Chemical Formulae 1 and 2, $R^{11}$ and $R^{12}$ are the same or different and are independently hydrogen or a quinone diazide sulfonyl group, wherein 50% or more of $R^{11}$ and $R^{12}$ in the photosensitive novolac resin is a quinone diazide sulfonyl group, $R^{13}$ and $R^{14}$ are the same or different and are independently C1 to C7 alkyl, and when the number of the structural unit of Chemical Formula 1 is x, and the number of the structural unit of Chemical Formula 2 is y in the photosensitive novolac resin, x+y ranges from about 2 to about 30, and x/(x+y) ranges from about 0.6 to about 0.95.

The novolac resin may have a weight average molecular weight (Mw) of about 500 to about 15,000.

Examples of the quinone diazide sulfonyl group may include without limitation a 1,2-naphthoquinone diazide-4-sulfonyl group represented by the following Chemical Formula 6, a 1,2-naphthoquinone diazide-5-sulfonyl group represented by the following Chemical Formula 7, a 1,2-benzoquinone diazide-4-sulfonyl group represented by the following Chemical Formula 8, and the like, and combinations thereof.

[Chemical Formula 6]

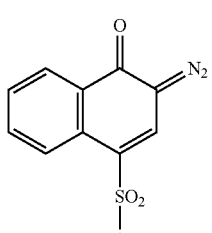

[Chemical Formula 7]

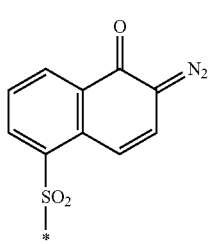

[Chemical Formula 8]

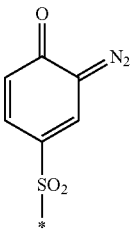

According to another embodiment, provided is a positive photosensitive resin composition that includes (A) a polybenzoxazole precursor including a structural unit represented by the following Chemical Formula 3, a structural unit represented by the following Chemical Formula 4, or a combination thereof; (B) the photosensitive novolac resin; and (C) a solvent.

[Chemical Formula 3]

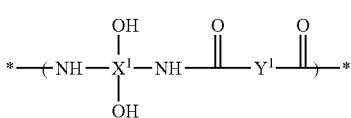

[Chemical Formula 4]

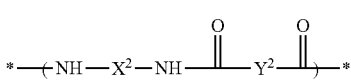

In Chemical Formulae 3 and 4, $X^1$ is independently a substituted or unsubstituted C6 to C30 aromatic organic group or a substituted or unsubstituted C1 to C30 alicyclic organic group, $X^2$ is independently a substituted or unsubstituted C6 to C30 aromatic organic group, a substituted or unsubstituted C3 to C30 alicyclic organic group, or a functional group represented by the following Chemical Formula 5, $Y^1$ and $Y^2$ are the same or different and are independently a substituted or unsubstituted C6 to C30 aromatic organic group or a substituted or unsubstituted C3 to C30 alicyclic organic group, and when the mol % of the structural unit of Chemical Formula 3 is m, and the mol % of the structural unit of Chemical Formula 4 is n in the polybenzoxazole precursor, and m+n is 100 mol %, m ranges from about 60 mol % to about 95 mol %, and n ranges from about 5 mol % to about 40 mol %.

[Chemical Formula 5]

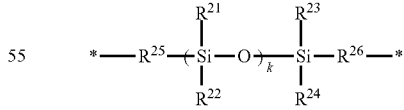

In Chemical Formula 5, $R^{21}$ to $R^{24}$ are the same or different and are independently hydrogen, substituted or unsubstituted C1 to C30 alkyl, substituted or unsubstituted C6 to C30 aryl, substituted or unsubstituted C1 to C30 alkoxy, or hydroxy, $R^{25}$ to $R^{26}$ are the same or different and are independently a single bond, substituted or unsubstituted C1 to C30 alkylene or substituted or unsubstituted C6 to C30 arylene, and k is an integer ranging from 1 to 50.

The polybenzoxazole precursor may have a weight average molecular weight (Mw) of about 3,000 to about 300,000.

The positive photosensitive resin composition may include about 5 parts by weight to about 150 parts by weight of the photosensitive novolac resin (B); and a balance amount of the solvent (C), based on about 100 parts by weight of the polybenzoxazole precursor (A).

According to yet another embodiment, a photosensitive resin film fabricated by using the positive photosensitive resin composition is provided.

According to still another embodiment, a semiconductor device including the photosensitive resin film is provided.

Further embodiments are described in the detailed description.

A photosensitive novolac resin that can have a high film residue ratio and sensitivity, a positive photosensitive resin composition including the same, a photosensitive resin film fabricated using the same, and a semiconductor device including the same are provided.

DETAILED DESCRIPTION

Figure 1:
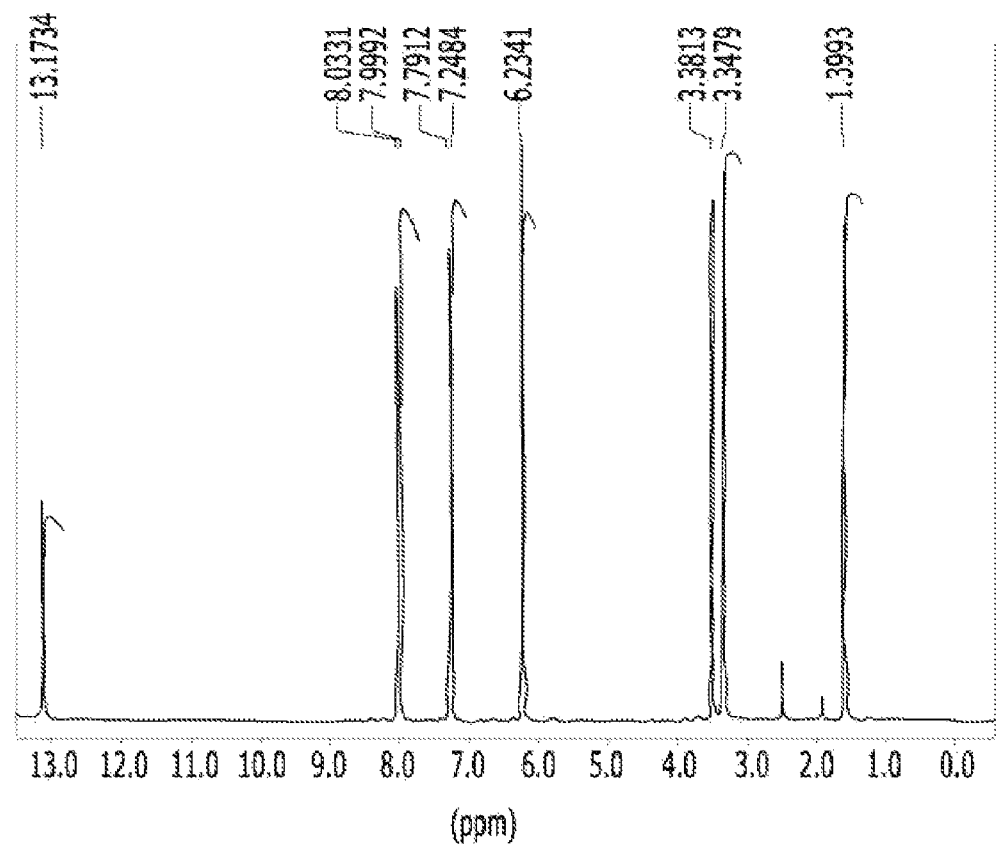
FIG. 1 is a graph showing $^1$H-NMR of 4-nadimido benzoic acid prepared in Synthesis Example 23.

The present invention will be described more fully hereinafter in the following detailed description of the invention, in which some but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a definition is not otherwise provided, the term "substituted" refers to one substituted with at least one substituent including halogen (F, Br, Cl, or I), a hydroxy group, a nitro group, a cyano group, an imino group (=NH, =NR, wherein R is C1 to C10 alkyl), an amino group (—NH$_2$, —NH(R'), —N(R'')(R'''), wherein R' to R''' are the same or different and are each independently C1 to C10 alkyl), an amidino group, a hydrazine or hydrazone group, a carboxyl group, C1 to C10 alkyl, C6 to C20 aryl, C3 to C20 cycloalkyl, C1 to C10 heteroalkyl, C3 to C20 heteroaryl, C2 to C20 heterocycloalkyl, or a combination thereof, instead of hydrogen in a functional group; at least one substituent including =O, =S, =NR (wherein R is C1 to C10 alkyl), =PR (wherein R is C1 to C10 alkyl), =SiRR' (wherein R and R' are the same or different and are independently C1 to C10 alkyl) or a combination thereof instead of two hydrogens; or at least one substituent including =N, =P, =SiR (wherein R is C1 to C10 alkyl) or a combination thereof, instead of three hydrogens.

As used herein, when a definition is not otherwise provided, the term "alkyl" may refer to C1 to C30 alkyl, for example C1 to C15 alkyl, the term "alkoxy" may refer to C1 to C30 alkoxy, for example C1 to C18 alkoxy, and the term "aryl" may refer to C6 to C30 aryl, for example C6 to C18 aryl.

As used herein, when a definition is not otherwise provided, the term "alicyclic organic group" may refer to C3 to C30 cycloalkyl, C3 to C30 cycloalkenyl, C3 to C30 cycloalkynyl, C3 to C30 cycloalkylene, C3 to C30 cycloalkenylene, or C3 to C30 cycloalkynylene, for example C3 to C15 cycloalkyl, C3 to C15 cycloalkenyl, C3 to C15 cycloalkynyl, C3 to C15 cycloalkylene, C3 to C15 cycloalkenylene, or C3 to C15 cycloalkynylene, and the term "aromatic organic group" may refer to C6 to C30 aryl or C6 to C30 arylene, for example C6 to C16 aryl or C6 to C16 arylene.

As used herein, when a definition is not otherwise provided, the term "combination" may refer to a mixture or a copolymer.

As used herein, "*" denotes a position linked to the same or different atom or Chemical Formula.

The photosensitive novolac resin according to one embodiment includes a structural unit represented by the following Chemical Formula 1 and a structural unit represented by the following Chemical Formula 2.

[Chemical Formula 1]

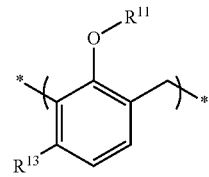

[Chemical Formula 2]

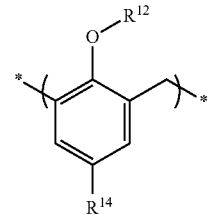

In Chemical Formulae 1 and 2, $R^{11}$ and $R^{12}$ are the same or different and are independently hydrogen or a quinone diazide sulfonyl group, wherein 50% or more of $R^{11}$ and $R^{12}$ in the photosensitive novolac resin is a quinone diazide sulfonyl group, $R^{13}$ and $R^{14}$ are independently C1 to C7 alkyl, and when the number of the structural unit of Chemical Formula 1 is x, and the number of the structural unit of Chemical Formula 2 is y in the photosensitive novolac resin, x+y ranges from about 2 to about 30, and x/(x+y) ranges from about 0.6 to about 0.95.

In one embodiment, x+y may range from about 4 to about 10.

In one embodiment, x/(x+y) may range from about 0.7 to about 0.85. When x/(x+y) is less than or equal to about 0.6, developability may be deteriorated, leaving a scum or a film residue around a developing area. In addition, when x/(x+y) is greater than or equal to about 0.95, a development rate may be extremely fast, improving sensitivity but accomplishing no uniform pattern size.

The novolac resin may have a weight average molecular weight (Mw) of about 500 to about 15,000, for example about 800 to about 5,000. When the novolac resin has a weight average molecular weight within the above range, the novolac resin may be well adjusted regarding dissolubility, improving developability and also, a light transmission degree during the UV exposure and resultantly, sensitivity and developability.

Examples of the quinone diazide sulfonyl group may include without limitation a 1,2-naphthoquinone diazide-4-sulfonyl group represented by the following Chemical Formula 6, a 1,2-naphthoquinone diazide-5-sulfonyl group represented by the following Chemical Formula 7, a 1,2-benzoquinone diazide-4-sulfonyl group represented by the following Chemical Formula 8, and the like, and combinations thereof.

[Chemical Formula 6]

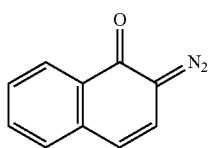

[Chemical Formula 7]

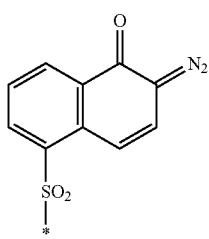

[Chemical Formula 8]

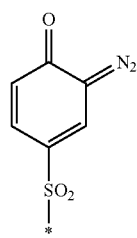

In one embodiment, the 1,2-naphtoquinone diazide-4-sulfonyl group or 1,2-naphtoquinone diazide-5-sulfonyl group may be used, and in another embodiment, the 1,2-naphtoquinone diazide-5-sulfonyl group may be used.

The 1,2-naphtoquinone diazide-4-sulfonyl group absorbs a light in an i-line region having a 365 nm wavelength and thus can be appropriate for an i-line exposure. The 1,2-naphtoquinone diazide-5-sulfonyl group absorbs a light in a vast wavelength region and thus can be appropriate for a light exposure in a vast wavelength. Accordingly, either an 1,2-naphtoquinone diazide-4-sulfonyl group or an 1,2-naphtoquinone diazide-5-sulfonyl group may be selected, or both of the 1,2-naphtoquinone diazide-4-sulfonyl group and the 1,2-naphtoquinone diazide-5-sulfonyl group may be combined depending on the exposed light wavelength.

The photosensitive novolac resin may be prepared by synthesizing a novolac resin having a phenolic hydroxy group and reacting it with quinone diazide sulfonic acid halide under halogenated hydrogen.

The novolac resin having a phenolic hydroxy group may include without limitation a structural unit represented by the following Chemical Formula 13, a structural unit represented by the following Chemical Formula 14, or a combination thereof.

[Chemical Formula 13]

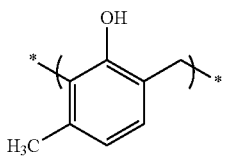

[Chemical Formula 14]

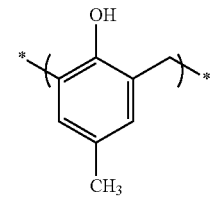

The novolac resin having a phenolic hydroxy group may be prepared by additionally condensing an aromatic compound having a phenolic hydroxy group and an aldehyde compound in the presence of an acid catalyst.

Examples of the aromatic compound having a phenolic hydroxy group may include without limitation m-cresol, p-cresol, and the like, and combinations thereof. When m-cresol is included in an amount of greater than or equal to about 60 mol %, sensitivity of a positive photosensitive resin composition may be improved.

Examples of the aldehyde compound may include without limitation formaldehyde, paraformaldehyde, furfural, benzaldehyde, nitrobenzaldehyde, acetaldehyde, and the like. The aldehyde compound may be used singularly or as a combination of two or more.

Examples of the acid catalyst may include without limitation inorganic acids such as hydrochloric acid, sulfuric acid, nitric acid, phosphoric acid, phosphorous acid, and the like; organic acids such as formic acid, oxalic acid, acetic acid, diethyl sulfuric acid, paratoluenesulfonic acid, and the like; metal salts such as zinc acetate, and the like. The acid catalyst may be used singularly or as a combination of two or more.

The photosensitive novolac resin can be prepared by substituting a quinone diazide sulfonyl group, for example, a 1,2-naphtoquinone diazide sulfonyl group, for a part of or all of hydrogen in the novolac resin having a phenolic hydroxy group.

The novolac resin having a phenolic hydroxy group may be prepared through an esterfication reaction with a quinone diazide sulfonic acid compound, for example, 1,2-naphtoquinone diazide sulfonic acid.

Examples of the quinone diazide sulfonic acid compound may include without limitation 1,2-naphthoquinone diazide-4-sulfonic acid chloride, 1,2-naphthoquinone diazide-5-sulfonic acid chloride, and the like, and combinations thereof.

The photosensitive novolac resin may be the most inhibited from dissolution in alkali in an unexposed part. In contrast, quinone diazide in the photosensitive novolac resin can be decomposed and turned into carboxylic acid in an exposed part, which changes novolac into carboxylic acid novolac and maximizes dissolution in an alkali aqueous solution.

The photosensitive polyimide precursor composition may maximize the solubility difference between the exposed part and the unexposed part and thus can provide a pattern that can have excellent sensitivity and resolution.

Specifically, a quinone diazide compound is substituted at a ballast structure capable of suppressing dissolution, so that a quinone diazide group is decomposed and produces a carboxyl group and thus, changes the composition from insoluble to soluble in alkali in the exposed part when radiated with a light having a wavelength ranging from 300 nm to 500 nm, while the composition is suppressed from dissolution in an alkali aqueous solution in the unexposed part.

However, some ballast structures substituted with the quinone diazide group may not easily maximize the solubility difference between the exposed part and the unexposed part. A hydroxy benzophenone-based compound has mainly been used as a ballast of a conventional dissolution inhibitor, but typically is used in a large amount to suppress dissolution when used in a photosensitive polyimide precursor composition. However, when the photosensitive polyimide precursor composition is used in a large amount, the exposed part may be more suppressed from dissolution, which can sharply deteriorate sensitivity and resolution.

In addition, another important factor for a photosensitive polyimide precursor composition is light transmittance. When the photosensitive polyimide precursor composition has high transmittance, contrast for a radiated light can be increased, which can increase resolution. In contrast, when the photosensitive polyimide precursor composition has low transmittance, contrast can be decreased, which can result in poor resolution.

Since a common photosensitive resin composition for an i-line or KrF mainly includes a novolac resin dissolved in alkali and similarly transmitting a g-line and an i-line, the novolac resin may be used for both the g-line and the i-line. However, as for a dissolution inhibitor in the photosensitive resin composition, a ballast constituting the dissolution inhibitor has a lot of influences on a pattern profile. The reason is that when a dissolution inhibitor for a g-line is used for an i-line, a ballast of the dissolution inhibitor has low transmittance due to its absorption in an i-line, deteriorating resolution and accomplishing a poor pattern profile. A hydroxy benzophenone-based compound has been mainly used as a conventional ballast of a dissolution inhibitor for a g-line. When the benzophenone-based dissolution inhibitor is used for an i-line, transmittance can be deteriorated, which can deteriorate resolution.

In contrast, the photosensitive novolac resin has polyhydric alcohol maximizing the difference between exposed and unexposed parts. The novolac resin is prepared by generally applying an alkali soluble resin to an i-line photosensitive resin composition and has a large difference between the exposed and unexposed parts, which can provide excellent sensitivity and resolution. In other words, dissolution suppression for an unexposed part in alkali is maximized, while dissolution for an exposed part is maximized, since a quinone diazide is decomposed and turns into carboxylic acid by substituting quinone diazide for the phenolic hydroxy group of a novolac resin.

The positive photosensitive resin composition according to another embodiment includes (A) a polybenzoxazole precursor including a structural unit represented by the following Chemical Formula 3, a structural unit represented by the following Chemical Formula 4, or a combination thereof; (B) the photosensitive novolac resin; and (C) a solvent.

[Chemical Formula 3]

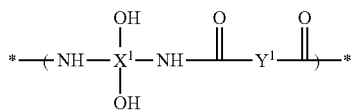

[Chemical Formula 4]

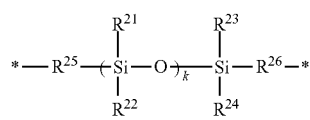

In Chemical Formulae 3 and 4, $X^1$ is independently a substituted or unsubstituted C6 to C30 aromatic organic group or a substituted or unsubstituted C1 to C30 alicyclic organic group, $X^2$ is independently a substituted or unsubstituted C6 to C30 aromatic organic group, a substituted or unsubstituted C3 to C30 alicyclic organic group, or a functional group represented by the following Chemical Formula 5, $Y^1$ and $Y^2$ are the same or different and are independently a substituted or unsubstituted C6 to C30 aromatic organic group or a substituted or unsubstituted C3 to C30 alicyclic organic group, and when the mol % of the structural unit of Chemical Formula 3 is m, and the mol % of the structural unit of Chemical Formula 4 is n in the polybenzoxazole precursor, and m+n is 100 mol %, m ranges from about 60 mol % to about 95 mol %, and n ranges from about 5 mol % to about 40 mol %.

[Chemical Formula 5]

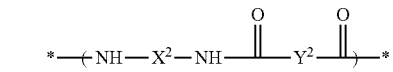

In Chemical Formula 5, $R^{21}$ to $R^{24}$ are the same or different and are independently hydrogen, substituted or unsubstituted C1 to C30 alkyl, substituted or unsubstituted C6 to C30 aryl, substituted or unsubstituted C1 to C30 alkoxy, or hydroxyl, $R^{25}$ to $R^{26}$ are the same or different and are independently a single bond, substituted or unsubstituted C1 to C30 alkylene, or substituted or unsubstituted C6 to C30 arylene, and k is an integer ranging from 1 to 50.

Hereinafter, each composition component is described in detail.

(A) Polybenzoxazole Precursor

The polybenzoxazole precursor includes a structural unit represented by the above Chemical Formula 3, a structural unit represented by the above Chemical Formula 4, or a combination thereof, and a thermally polymerizable functional group at least one terminal end.

In Chemical Formula 3, $X^1$ may be a residual group derived from an aromatic diamine.

Examples of the aromatic diamine may include without limitation 3,3'-diamino-4,4'-dihydroxybiphenyl, 4,4'-diamino-3,3'-dihydroxybiphenyl, bis(3-amino-4-hydroxyphenyl)propane, bis(4-amino-3-hydroxyphenyl)propane, bis(3-amino-4-hydroxyphenyl)sulfone, bis(4-amino-3-hydroxyphenyl)sulfone, 2,2-bis(3-amino-4-hydroxyphenyl)-1,1,1,3,3,3-hexafluoropropane, 2,2-bis(4-amino-3-hydroxyphenyl)-1,1,1,3,3,3-hexafluoropropane, 2,2-bis(3-amino-4-hydroxy-5-trifluoromethylphenyl)hexafluoropropane, 2,2-bis(3-amino-4-hydroxy-6-trifluoromethylphenyl)hexafluoropropane, 2,2-bis(3-amino-4-hydroxy-2-trifluoromethylphenyl)hexafluoropropane, 2,2-bis(4-amino-3-hydroxy-5-trifluoromethylphenyl)hexafluoropropane, 2,2-bis(4-amino-3-hydroxy-6-trifluoromethylphenyl)hexafluoropropane, 2,2-bis(4-amino- 3-hydroxy-2-trifluoromethylphenyl)hexafluoropropane, 2,2-bis(3-amino-4-hydroxy-5-pentafluoroethylphenyl)hexafluoropropane, 2-(3-amino-4-hydroxy-5-trifluoromethylphenyl)-2-(3-amino-4-hydroxy-5-pentafluoroethylphenyl)hexafluoropropane, 2-(3-amino-4-hydroxy-5-trifluoromethyl phenyl)-2-(3-hydroxy-4-amino-5-trifluoromethylphenyl)hexafluoropropane, 2-(3-amino-4-hydroxy-5-trifluoromethyl phenyl)-2-(3-hydroxy-4-amino-6-trifluoromethylphenyl)hexafluoropropane, 2-(3-amino-4-hydroxy-5-trifluoromethyl phenyl)-2-(3-hydroxy-4-amino-2-trifluoromethylphenyl)hexafluoropropane, 2-(3-amino-4-hydroxy-2-trifluoromethyl phenyl)-2-(3-hydroxy-4-amino-5-trifluoromethylphenyl)hexafluoropropane, 2-(3-amino-4-hydroxy-6-trifluoromethylphenyl)-2-(3-hydroxy-4-amino-5-trifluoromethylphenyl)hexafluoropropane, and the like, and combinations thereof.

$X^1$ may include a functional group represented by the following Chemical Formulae 15 and 16, or a combination thereof, but is not limited thereto.

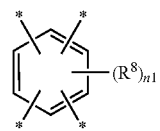

[Chemical Formula 15]

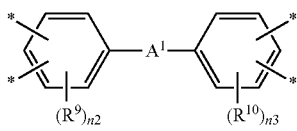

[Chemical Formula 16]

In Chemical Formulae 15 and 16, $A^1$ is O, CO, $CR^{203}R^{204}$, $SO_2$, S or a single bond, wherein $R^{203}$ and $R^{204}$ are the same or different and are each independently hydrogen or substituted or unsubstituted alkyl, for example fluoroalkyl, $R^8$ to $R^{10}$ are the same or different and are each independently hydrogen, substituted or unsubstituted alkyl, substituted or unsubstituted carboxyl group, hydroxy group, or thiol group, $n_1$ is an integer ranging from 1 to 2, and $n_2$ and $n_3$ are the same or different and are each independently integers ranging from 1 to 3.

$X^2$ may be a residual group derived from aromatic diamine, alicyclic diamine, or silicon diamine.

Examples of the aromatic diamine may include without limitation 3,4'-diaminodiphenylether, 4,4'-diaminodiphenylether, 3,4'-diaminodiphenylmethane, 4,4'-diaminodiphenylmethane, 4,4'-diaminodiphenylsulfone, 4,4'-diaminodiphenylsulfide, benzidine, m-phenylenediamine, p-phenylenediamine, 1,5-naphthalenediamine, 2,6-naphthalenediamine, bis(4-aminophenoxyphenyl)sulfone, bis(3-aminophenoxyphenyl)sulfone, bis(4-aminophenoxy)biphenyl, bis[4-(4-aminophenoxy)phenyl]ether, 1,4-bis(4-aminophenoxy)benzene, compounds having an alkyl group or a halogen substituted in an aromatic ring of the foregoing compounds, and the like, and combination thereofs.

Examples of the alicyclic diamine may include without limitation 1,4-diaminocyclohexane, 1,3-diaminocyclohexane, 1,2-diaminocyclohexane, 4,4'-methylenebiscyclohexylamine, 4,4'-methylenebis(2-methylcyclohexylamine), and the like, and combinations thereof.

Examples of the silicon diamine may include without limitation bis(4-aminophenyl)dimethylsilane, bis(4-aminophenyl)tetramethylsiloxane, bis(p-aminophenyl)tetramethyldisiloxane, bis(γ-aminopropyl)tetramethyldisiloxane, 1,4-bis(γ-aminopropyldimethylsilyl)benzene, bis(4-aminobutyl)tetramethyldisiloxane, bis(γ-aminopropyl)tetraphenyldisiloxane, 1,3-bis(aminopropyl)tetramethyldisiloxane, and the like, and combinations thereof.

Examples of $X^2$ may include functional groups represented by the following Chemical Formulae 17 to 20, and combinations thereof, but are not limited thereto.

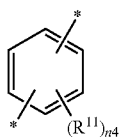

[Chemical Formula 17]

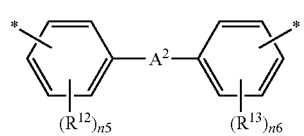

[Chemical Formula 18]

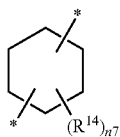

[Chemical Formula 19]

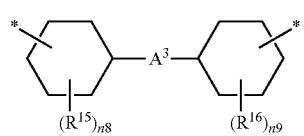

[Chemical Formula 20]

In Chemical Formulae 17 to 20, $A^2$ and $A^3$ are the same or different and are independently O, CO, $CR^{206}R^{206}$, $SO_2$, S, or a single bond, wherein $R^{205}$ and $R^{206}$ are the same or different and are each independently hydrogen or substituted or unsubstituted alkyl, for example fluoroalkyl, $R^{11}$ to $R^{16}$ are the same or different and are each independently hydrogen, substituted or unsubstituted alkyl, substituted or unsubstituted carboxyl group, hydroxy group, or thiol group, $n_4$ and $n_7$ are the same or different and are each independently integers ranging from 1 to 4, and $n_5$, $n_6$, $n_s$, and $n_9$ are the same or different and are independently integers ranging from 1 to 5.

$Y^1$ and $Y^2$ may be a residual group derived from a dicarboxylic acid or a residual group derived from a dicarboxylic acid derivative.

Examples of the dicarboxylic acid include without limitation $Y^1(COOH)_2$ or $Y^2(COOH)_2$ (wherein $Y^1$ and $Y^2$ are the same as $Y^1$ and $Y^2$ of the above Chemical Formulae 3 and 4).

Examples of the carboxylic acid derivative include without limitation carbonyl halide derivatives of $Y^1(COOH)_2$, carbonyl halide derivatives of $Y^2(COOH)_2$, active compounds of an active ester derivative obtained by reacting $Y^1(COOH)_2$ and 1-hydroxy-1,2,3-benzotriazole, active compounds of an active ester derivative obtained by reacting $Y^2(COOH)_2$ with 1-hydroxy-1,2,3-benzotriazole (wherein $Y^1$ and $Y^2$ are the same as $Y^1$ and $Y^2$ of the above Chemical Formulae 3 and 4), and the like, and combinations thereof.

Examples of the dicarboxylic acid derivative may include without limitation 4,4'-oxydibenzoylchloride, diphenyloxydicarbonyldichloride, bis(phenylcarbonylchloride)sulfone, bis(phenylcarbonylchloride)ether, bis(phenylcarbonylchloride)phenone, phthaloyldichloride, terephthaloyldichloride, isophthaloyldichloride, dicarbonyldichloride, diphenyloxydicarboxylatedibenzotriazole, and the like, and combinations thereof.

$Y^1$ and $Y^2$ may include functional groups represented by the following Chemical Formulae 21 to 23, or a combination thereof, but are not limited thereto.

[Chemical Formula 21]

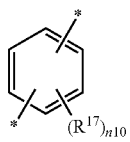

[Chemical Formula 22]

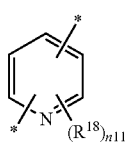

[Chemical Formula 23]

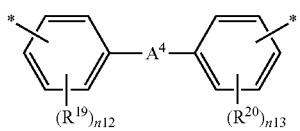

In Chemical Formulae 21 to 23, $R^{17}$ to $R^{20}$ are the same or different and are each independently hydrogen or substituted or unsubstituted alkyl, $n_{10}$ is an integer ranging from 1 to 4, $n_{11}$, $n_{12}$ and $n_{13}$ are the same or different and are integers ranging from 1 to 3, and $A^4$ is O, $CR^{207}R^{208}$, CO, CONH, S, $SO_2$, or a single bond, wherein $R^{207}$ and $R^{208}$ are the same or different and are each independently hydrogen or substituted or unsubstituted alkyl, for example fluoroalkyl.

The polybenzoxazole precursor may include a thermally polymerizable functional group at least one terminal end. The thermally polymerizable organic group may form a bond with a hydroxy group included in the photosensitive novolac resin in a subsequent process.

The thermally polymerizable organic group may be derived from an end-capping monomer. Examples of the end-capping monomer may include without limitation monoamines, monoanhydrides, monocarboxylic acid halides including a carbon-carbon multiple bond, and the like, and combinations thereof.

Examples of the monoamines include without limitation toluidine, dimethylaniline, ethylaniline, aminophenol, aminobenzylalcohol, aminoindan, aminoacetophenone, and the like, and combinations thereof.

Examples of the monoanhydrides include without limitation 5-norbornene-2,3-dicarboxylanhydride represented by the following Chemical Formula 16, 3,6-epoxy-1,2,3,6-tetrahydrophthalicanhydride represented by the following Chemical Formula 17, isobutenyl succinic anhydride represented by the following Chemical Formula 18, maleic anhydride, aconitic anhydride, 3,4,5,6-tetrahydrophthalic anhydride, cis-1, 2,3,6-tetrahydrophthalic anhydride, itaconic anhydride (IA), citraconic anhydride (CA), 2,3-dimethylmaleic anhydride (DMMA), and the like, and combinations thereof.

[Chemical Formula 24]

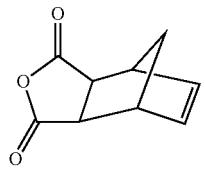

[Chemical Formula 25]

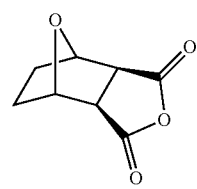

[Chemical Formula 26]

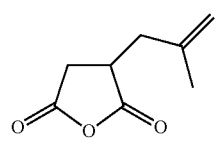

The thermally polymerizable functional group derived from the monoanhydrides includes a functional group represented by the following Chemical Formulae 27 to 31, or a combination thereof, but is not limited thereto. The thermally polymerizable functional group may be formed as a residual group at the terminal end of the polybenzoxazole precursor through cross-linking during heating of the polybenzoxazole precursor preparation process.

[Chemical Formula 27]

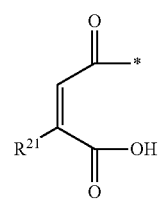

In Chemical Formula 27, $R^{21}$ is H, $CH_2COOH$, or $CH_2CHCHCH_3$.

[Chemical Formula 28]

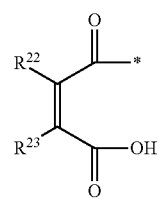

In Chemical Formula 28, $R^{22}$ and $R^{23}$ are the same or different and are each independently H or $CH_3$.

[Chemical Formula 29]

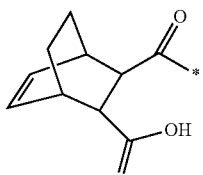

[Chemical Formula 30]

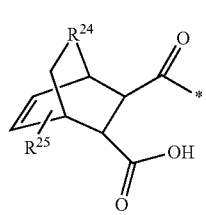

In Chemical Formula 30,
$R^{24}$ is $CH_2$ or O, and $R^{25}$ is H or $CH_3$.

[Chemical Formula 31]

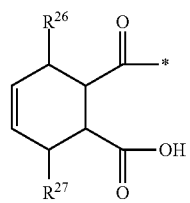

In Chemical Formula 31,
$R^{26}$ and $R^{27}$ are the same or different and are each independently, H, $CH_3$, or $OCOCH_3$.

The monocarboxylic acid halides including the carbon-carbon multiple bonds may be represented by the following Chemical Formula 32.

[Chemical Formula 32]

In Chemical Formula 32,
$R^{28}$ is a substituted or unsubstituted alicyclic organic group or substituted or unsubstituted aromatic organic group, wherein the substituted alicyclic organic group or the substituted aromatic organic group is substituted with a substituent including a substituted or unsubstituted amidino group, a substituted or unsubstituted alicyclic organic group, a fused ring of a substituted or unsubstituted alicyclic organic group with an aryl group, or a combination thereof, and the substituted alicyclic organic group may be a maleimide group, and
$Z^1$ is F, Cl, Br, or I.

Examples of the monocarboxylic acid halides including a carbon-carbon multiple bond include without limitation 5-norbornene-2-carboxylic acid halide represented by the following Chemical Formula 33, 4-nadimido benzoylhalide represented by the following Chemical Formula 34, 4-(3-phenylethynylphthimido)benzoylhalide represented by the following Chemical Formula 35, 4-(2-phenylmaleicimido)benzoylhalide represented by the following Chemical Formula 36, benzoylhalide represented by the following Chemical Formula 37, cyclobenzoylhalide represented by the following Chemical Formula 38, 4-(3-phenylethynylphthimido)benzoylhalide, 4-maleimido benzoylhalide, and the like, and combinations thereof. These may be used singularly or in combination.

[Chemical Formula 33]

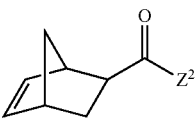

[Chemical Formula 34]

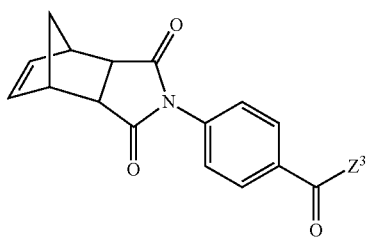

[Chemical Formula 35]

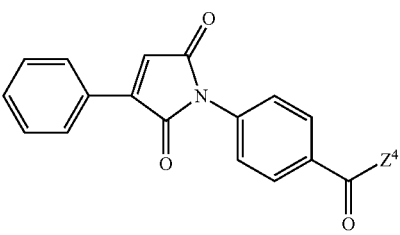

[Chemical Formula 36]

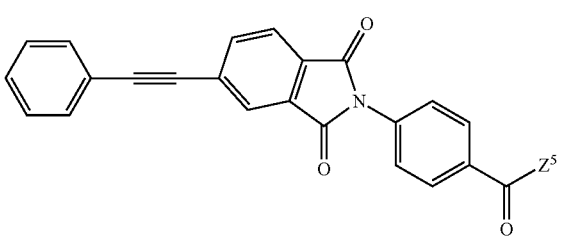

[Chemical Formula 37]

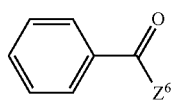

[Chemical Formula 38]

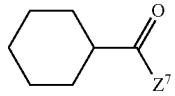

In Chemical Formulae 33 to 38,
$Z^2$ to $Z^7$ are the same or different and are each independently F, Cl, Br, or I.

In one embodiment, the monocarboxylic acid halides including a carbon-carbon multiple bond may include a monocarboxylic acid chloride including a carbon-carbon multiple bond. Examples of the monocarboxylic acid chloride may include without limitation a 5-norbornene-2-carboxylic acid chloride represented by the following Chemical Formula 39, 4-nadimido benzoylchloride represented by the following Chemical Formula 40, 4-(3-phenylethynylphthalimido)benzoylchloride represented by the following Chemical Formula 41, 4-(2-phenyl maleimido)benzoylchloride represented by the following Chemical Formula 42, and the like, and combinations thereof.

[Chemical Formula 39]

[Chemical Formula 40]

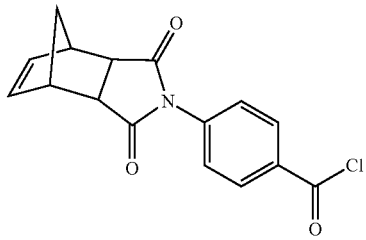

[Chemical Formula 41]

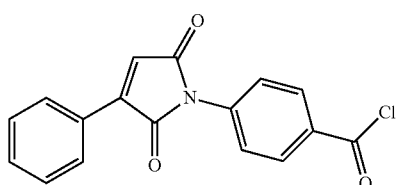

[Chemical Formula 42]

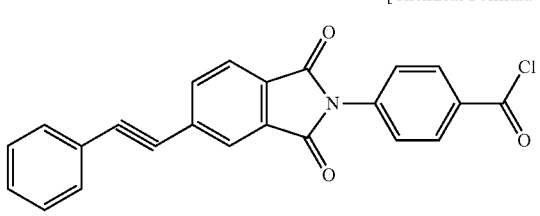

The polybenzoxazole precursor may have a weight average molecular weight (Mw) of about 3,000 to about 300,000. When the polybenzoxazole precursor has a weight average molecular weight within the above range, the composition may have sufficient properties and simultaneously, sufficient dissolution in an organic solvent. In one embodiment, the polybenzoxazole precursor may have a weight average molecular weight of about 5,000 to about 100,000.

(B) Photosensitive Novolac Resin

The photosensitive novolac resin of the positive photosensitive resin composition is the same as described above.

The positive photosensitive resin composition may include the photosensitive novolac resin in an amount of about 5 parts by weight to about 150 parts by weight, for example about 20 parts by weight to about 80 parts by weight, based on about 100 parts by weight of the polybenzoxazole precursor. In some embodiments, the positive photosensitive resin composition may include the photosensitive novolac resin in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, 100, 101, 102, 103, 104, 105, 106, 107, 108, 109, 110, 111, 112, 113, 114, 115, 116, 117, 118, 119, 120, 121, 122, 123, 124, 125, 126, 127, 128, 129, 130, 131, 132, 133, 134, 135, 136, 137, 138, 139, 140, 141, 142, 143, 144, 145, 146, 147, 148, 149, or 150 parts by weight. Further, according to some embodiments of the present invention, the amount of the photosensitive novolac resin can be in a range from about any of the foregoing amounts to about any other of the foregoing amounts.

When the photosensitive novolac resin is included in an amount within the above range, the photosensitive novolac resin may effectively control an unexposed part to be nonpolar and an exposed part to be polar, and can thereby effectively improve alkali developability of the exposed part.

(C) Solvent

The solvent may be an organic solvent. Examples of the organic solvent may include without limitation N-methyl-2-pyrrolidone, gamma-butyrolactone, N,N-dimethylacetate, dimethylsulfoxide, diethyleneglycoldimethylether, diethyleneglycoldiethylether, diethyleneglycoldibutylether, propyleneglycolmono methylether, dipropyleneglycolmonomethylether, propyleneglycolmonomethylether acetate, methyllactate, ethyl lactate, butyl lactate, methyl-1,3-butyleneglycolacetate, 1,3-butyleneglycol-3-monomethylether, methyl pyruvate, ethyl pyruvate, methyl-3-methoxy propionate, and the like, and combinations thereof. The solvent may be used singularly or as a mixture of two or more.

The solvent may be used in a balance amount, for example in one embodiment, in an amount of about 50 parts by weight to about 900 parts by weight based on about 100 parts by weight of the polybenzoxazole precursor. When the solvent is used in an amount within the above range, a sufficiently thick film can be obtained, and good solubility and coating can be provided.

(D) Silane Compound

The photosensitive resin composition may further include a silane compound in order to improve adherence with a substrate.

Examples of the silane compound may include without limitation compounds represented by the following Chemical Formulae 46 to 48; vinyltrimethoxysilane, vinyltriethoxysilane, vinyltrichlorosilane, vinyltris(β-methoxyethoxy)silane; 3-methacryloxypropyltrimethoxysilane, 3-acryloxypropyltrimethoxysilane, p-styryltrimethoxysilane, 3-methacryloxypropylmethyldimethoxysilane, 3-methacryloxypropylmethyldiethoxysilane; silane compounds including carbon-carbon unsaturated bond such as trimethoxy[3-(phenylamino)propyl]silane, and the like, and combinations thereof.

[Chemical Formula 46]

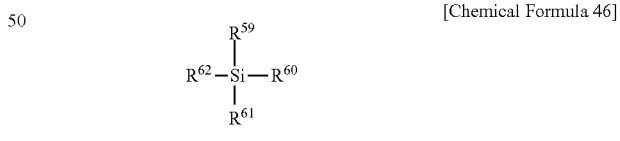

In Chemical Formula 46, $R^{59}$ is a vinyl group, substituted or unsubstituted alkyl, a substituted or unsubstituted alicyclic organic group, or substituted or unsubstituted aryl, for example 3-(meth)acryloxypropyl, p-styryl, 2-(3,4-epoxycyclohexyl)ethyl or 3-(phenylamino)propyl, and $R^{60}$ to $R^{62}$ are the same or different and are each independently substituted or unsubstituted alkoxy, substituted or unsubstituted alkyl, or halogen, wherein at least one of $R^{60}$ to $R^{62}$ is alkoxy or halogen, for example the alkoxy may be C1 to C8 alkoxy, and the alkyl may be C1 to C20 alkyl.

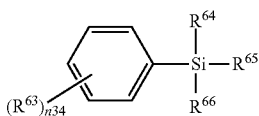

[Chemical Formula 47]

In Chemical Formula 47, $R^{63}$ is $NH_2$ or $CH_3CONH$, $R^{64}$ to $R^{66}$ are the same or different and are each independently substituted or unsubstituted alkoxy, for example $OCH_3$ or $OCH_2CH_3$, and $n_{34}$ is an integer ranging from 1 to 5.

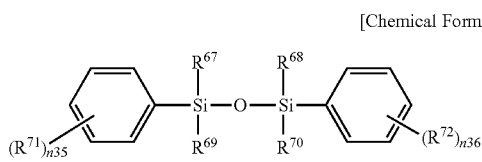

[Chemical Formula 48]

In Chemical Formula 48, $R^{67}$ to $R^{70}$ are the same or different and are each independently substituted or unsubstituted alkyl or substituted or unsubstituted alkoxy, for example $CH_3$ or $OCH_3$, $R^{71}$ and $R^{72}$ are the same or different and are each independently a substituted or unsubstituted amino group, for example $NH_2$ or $CH_3CONH$, and $n_{35}$ and $n_{36}$ are the same or different and are each independently integers ranging from 1 to 5.

The positive photosensitive resin composition may include the silane compound in an amount of about 0.1 parts by weight to about 30 parts by weight based on about 100 parts by weight of the polybenzoxazole precursor. In some embodiments, the positive photosensitive resin composition may include the silane compound in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 parts by weight. Further, according to some embodiments of the present invention, the amount of the silane compound can be in a range from about any of the foregoing amounts to about any other of the foregoing amounts.

When the silane compound is included in an amount within the above range, adherence between lower and upper layers can be sufficiently improved, residual film may not remain after development, and optical properties (transmittance) and mechanical properties such as tensile strength, elongation, and the like may be improved.

(E) Other Additive(s)

The positive photosensitive resin composition may further include one or more other additives (E) in addition to the components (A) to (D).

The other additive can include a latent thermal acid generator. Examples of the latent thermal acid generator include without limitation arylsulfonic acids such as p-toluenesulfonic acid, benzenesulfonic acid, and the like; perfluoroalkylsulfonic acids such as trifluoromethanesulfonic acid, trifluorobutanesulfonic acid, and the like; alkylsulfonic acids such as methanesulfonic acid, ethanesulfonic acid, butanesulfonic acid, and the like; and the like; and combinations thereof.

The latent thermal acid generator is a catalyst for a dehydration reaction and a cyclization reaction of the polybenzoxazole precursor that is polyamide including a phenolic hydroxy group, and thus a cyclization reaction may be performed smoothly even if curing temperature is decreased.

In addition, the positive photosensitive resin composition may further include an additive such as a suitable surfactant and/or leveling agent to prevent staining of the film and/or to improve development.

The process for forming a pattern using a positive photosensitive resin composition can include: coating a positive photosensitive resin composition on a supporting substrate; drying the coated positive photosensitive resin composition to provide a positive photosensitive resin composition layer; exposing the positive photosensitive resin composition layer; developing the positive photosensitive resin composition layer using an alkali aqueous solution to provide a photosensitive resin film; and heating the photosensitive resin film. The conditions of processes to provide a pattern are widely known in this art, so detailed descriptions thereof will be omitted in this specification.

The photosensitive resin film according to another embodiment is fabricated using the positive photosensitive resin composition.

The photosensitive resin film may be an insulation layer or a protective layer.

According to yet another embodiment, a semiconductor device including the photosensitive resin layer is provided.

The positive photosensitive resin composition may be applicable for forming an insulation layer, a passivation layer, or a buffer coating layer of a semiconductor device. That is to say, the positive photosensitive resin composition may be applicable for forming a surface protective layer and an interlayer insulating layer of a semiconductor device.

The following examples illustrate the present invention in more detail. However, it is understood that the present invention is not limited by these examples.

Photosensitive Novolac Resin

Synthesis Examples 1 to 10

Synthesis of Alkali Soluble Novolac Resin

Synthesis Example 1 mp91-500

100 g of a mixed solution of m-cresol and p-cresol mixed in a weight ratio of 90:10 is put in a 500 mL three-necked flask, and 23.4 g of formaldehyde (0.35 mole relative to 1.0 mole of the mixed solution of m-cresol and p-cresol) is added thereto. Then, 0.3 g of an oxalic acid catalyst (0.3 parts by weight based on 100 parts by weight of a mixed solution of m-cresol and p-cresol) is added to the mixture, and the resulting mixture is agitated for one hour. The agitated product is agitated at a temperature ranging from 100° C. to 105° C. for 4 hours for an additional condensation reaction, obtaining a cresol novolac resin. When the reaction is complete, the temperature of the reactant is increased up to 200° C., and water generated during the condensation and a non-reaction monomer are removed from the reactant at 1 atm. Additionally, the resulting reactant is heated at 200° C. under vacuum to completely remove non-reacted monomer and water, obtaining 45 g of an alkali soluble novolac resin having a weight average molecular weight of 500.

Synthesis Example 2 mp91-2000

47 g of an alkali soluble novolac resin having a weight average molecular weight of 2000 is prepared according to the same method as Synthesis Example 1 except for using 47.5 g of formaldehyde (0.7 mole relative to 1.0 mole of a mixed solution of m-cresol and p-cresol).

Synthesis Example 3 mp82-500

50 g of an alkali soluble novolac resin having a weight average molecular weight 500 is prepared according to the same method as Synthesis Example 1 except for mixing m-cresol and p-cresol in a weight ratio of 90:10 and using 24.8 g of formaldehyde (0.37 mole based on 1.0 mole of a mixed solution of m-cresol and p-cresol).

Synthesis Example 4 mp82-2000

47 g of an alkali soluble novolac resin having a weight average molecular weight of 2000 is prepared according to the same method as Synthesis Example 3 except for using 48.2 g of formaldehyde (0.72 mole relative to 1.0 mole of a mixed solution of m-cresol and p-cresol).

Synthesis Example 5 mp73-500

49 g of an alkali soluble novolac resin having a weight average molecular weight of 500 is prepared according to the same method as Synthesis Example 1 except for mixing m-cresol and p-cresol in a weight ratio of 70:30 and using 26.8 g of formaldehyde (0.4 mole relative to 1.0 mole of m-cresol and p-cresol).

Synthesis Example 6 mp73-2000

50 g of an alkali soluble novolac resin having a weight average molecular weight of 2000 is prepared according to the same method as Synthesis Example except for using 48.8 g of formaldehyde (0.73 mole relative to 1.0 mole of a mixed solution of m-cresol and p-cresol).

Synthesis Example 7 mp55-500

45 g of an alkali soluble novolac resin having a weight average molecular weight of 500 is prepared according to the same method as Synthesis Example 1 except for mixing m-cresol and p-cresol in a weight ratio of 50:50 and using 21.4 g of formaldehyde (0.32 mole relative to 1.0 mole of a mixed solution of m-cresol and p-cresol).

Synthesis Example 8 mp55-2000

42 g of an alkali soluble novolac resin having a weight average molecular weight of 2000 is prepared according to the same method as Synthesis Example 7 except for using 33.5 g of formaldehyde (0.5 mole relative to 1.0 mole of a mixed solution of m-cresol and p-cresol).

Synthesis Example 9 mp46-500

46 g of an alkali soluble novolac resin having a weight average molecular weight of 500 is prepared according to the same method as Synthesis Example 1 except for mixing m-cresol and p-cresol in a weight ratio of 40:60 and using 20.1 g of formaldehyde (0.3 mole relative to 1.0 mole of a mixed solution of m-cresol and p-cresol).

Synthesis Example 10 mp46-2000

45 g of an alkali soluble novolac resin having a weight average molecular weight of 2000 is prepared according to the same method as Synthesis Example 9 except for using 34.8 g of formaldehyde (0.52 mole relative to 1.0 mole of a mixed solution of m-cresol and p-cresol).

Synthesis Examples 11 to 20

Substitution of Quinone Diazide in Alkali Soluble Novolac Resin

Synthesis Example 11 mp91-500

1.5 g of the mp91-500 according to Synthesis Example 1, 4.5 g of 1,2-naphthoquinone diazide-4-sulfonic acid chloride (a mole ratio is 1:4 and since the mp-91-500 has a molecular weight of 500 and has about four phenolic hydroxy groups, from which the number of functional groups for a reaction are calculated to be four), and 32 g of 1,4-dioxane are put in a 100 ml 4-necked flask, and the mixture is slowly agitated. The agitated reactant is maintained at room temperature of 25° C., and 2.8 g of triethylamine is slowly added thereto in a drop-wise fashion for 1 hour. The resulting mixture is agitated at 35° C. for 1 hour, and 0.6 g of acetic acid is added thereto. The mixture is additionally agitated at the same temperature for 1 hour. The reaction mixture is filtered and washed with 5.7 g of 1,4-dioxane. Then, the washed product is added to a mixture of 0.4 g of acetic acid and 40 g of ion exchanged water. The mixture is agitated for 1 hour. The precipitate is filtered, and the obtained wet cake is agitated and cleaned with 50 g of ion exchanged water. The cleaned cake is dried at 40° C., obtaining 5.6 g of a photosensitive novolac resin.

Synthesis Example 12 mp91-2000

1.5 g of the mp91-2000 according to Synthesis Example 2, 24 g of 1,2-naphthoquinone diazide-4-sulfonic acid chloride (a mole ratio of 1:16, the mp-91-500 has a molecular weight of 2000 and has 16 phenolic hydroxy groups, from which the number of functional groups for a reaction are calculated to be 16), 200 g of 1,4-dioxane is added thereto. The mixture is slowly agitated. The agitated product is maintained at room temperature of 25° C., and 16 g of triethylamine is slowly added thereto for 1 hour. The resulting mixture is agitated at 35° C. for 1 hour, and 4 g of acetic acid is added thereto. The mixture is additionally agitated at the same temperature for 1 hour. The reaction mixture is filtered and washed with 50 g of 1,4-dioxane. The washed product is added to a mixture of 21 g of acetic acid and 250 g of ion exchanged water. The mixture is agitated for one hour. The precipitate is filtered, and the obtained wet cake is agitated and washed with 35 g of ion exchanged water. The obtained cake is dried at 40° C., obtaining 27 g of a photosensitive novolac resin.

Synthesis Example 13 mp82-500

A photosensitive novolac resin is prepared according to the same method as Synthesis Example 11 except for using the mp82-500 according to Synthesis Example 3 instead of the mp91-500 according to Synthesis Example 1.

Synthesis Example 14 mp82-2000

A photosensitive novolac resin is prepared according to the same method as Synthesis Example 12 except for using the mp82-2000 according to Synthesis Example 4 instead of the mp91-500 according to Synthesis Example 1.

Synthesis Example 15 mp73-500

A photosensitive novolac resin is prepared according to the same method as Synthesis Example 12 except for using the mp73-500 according to Synthesis Example 5 instead of the mp91-500 according to Synthesis Example 1.

Synthesis Example 16 mp73-2000

A photosensitive novolac resin is prepared according to the same method as Synthesis Example 12 except for using the mp73-2000 according to Synthesis Example 6 instead of the mp91-500 according to Synthesis Example 2.

Synthesis Example 17 mp55-500

A photosensitive novolac resin is prepared according to the same method as Synthesis Example 11 except for using the mp55-500 according to Synthesis Example 7 instead of the mp91-500 according to Synthesis Example 1.

Synthesis Example 18 mp55-2000

A photosensitive novolac resin is prepared according to the same method as Synthesis Example 12 except for using the mp55-2000 according to Synthesis Example 8 instead of the mp91-2000 according to Synthesis Example 2.

Synthesis Example 19 mp46-500

A photosensitive novolac resin is prepared according to the same method as Synthesis Example 11 except for using the mp46-500 according to Synthesis Example 9 instead of the mp91-500 according to Synthesis Example 1.

Synthesis Example 20 mp46-2000

A photosensitive novolac resin is prepared according to the same method as Synthesis Example 12 except for using the mp46-2000 according to Synthesis Example 10 instead of the mp91-2000 according to Synthesis Example 2.

Synthesis Examples 21 and 22

Photosensitive Diazoquinone Synthesis

Synthesis Example 21

1,3-dihydroxy(dihydroxy)-4-(4-hydroxy(hydroxy)-2,5-dimethyl benzyl(dimethylbenzyl))benzene(benzene)

22.02 g of resorcinol, 1.90 g of p-toluene sulfonic acid, and 44.04 g of water are put in a 100 ml 4-necked flask, and 7.61 g of 4-hydroxymethyl(hydroxymethyl)-2,5-Xylenol is partly added thereto for one hour while maintaining at room temperature of 25° C. The mixture is reacted for 3 hours at the same temperature. Then, 50 g of acetic acid and 50 g of toluene are added to the reaction mass, separating a phase. The obtained organic layer is washed and concentrated. The obtained precipitate is filtered. The filtered product is rinsed with toluene, dried under reduced pressure for 24 hours, and treated through liquid chromatography, obtaining 7.94 g of 1,3-dihydroxy-4-(4-hydroxy-2,5-dimethyl benzyl)benzene having a purity of 99%.

Synthesis Example 22

Quinone diazide sulfonic acid esterification of 1,3-dihydroxy-4-(4-hydroxy-2,5-dimethyl benzyl)benzene 1.22 g of 1,3-dihydroxy-4-(4-hydroxy-2,5-dimethyl benzyl)benzene, 4.03 g of 1,2-naphthoquinone diazide-5-sulfonic acid chloride in a mole ratio of 1:3 are put in a 50 ml 4-necked flask, and 26.26 g of 1,4-dioxane is added thereto. The mixture is slowly agitated. Then, 1.82 g of triethylamine is slowly added thereto in a dropwise fashion for one hour while maintaining at room temperature of 25° C. The resulting mixture is agitated at 35° C. for 1 hour, and 0.6 g of acetic acid is added thereto. The mixture is additionally agitated at 35° C. for 1 hour. The reaction mixture is filtered and washed with 4.03 g of 1,4-dioxane. The washed product is put in a mixture of 0.4 g of acetic acid and 40 g of ion exchanged water. The mixture is agitated for 1 hour. The obtained precipitated is filtered, obtaining a wet cake. The wet cake is agitated and washed with 50 g of ion exchanged water. Then, the cake is dried at 40° C., obtaining 4.65 g of photosensitive diazoquinone represented by the following Chemical Formula 50.

[Chemical Formula 50]

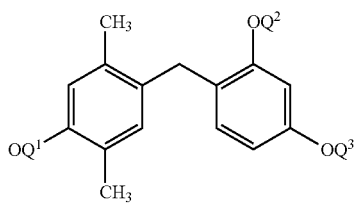

In Chemical Formula 50, $Q^1$ to $Q^3$ are an 1,2-naphtoquinone diazide-5-sulfonyl group.

Synthesis Examples 23 and 24

Synthesis of End-Capping Agent)

Synthesis Example 23

4-nadimido benzoylchloride (EC-1)

8.0 g of 4-aminobenzoic acid and 9.5 g of 5-norbornene-2,3-dicarboxylic acidanhydride are put in a 4-necked flask having an agitator, a temperature controller, a nitrogen gas injector, and a cooler, while nitrogen is passed therethrough and 150 ml of acetic acid is added thereto This mixture is agitated for 1 hour at room temperature of 25° C., and the temperature of the agitated product is increased until a solvent therein is refluxed and then, further agitated for 12 hours. The solution is cooled down to room temperature, and the precipitated white solid is filtered and washed three times with cold ethanol. The obtained solid is heated up to 100° C. under vacuum and dried for 12 hours. The prepared 4-nadimido benzoic acid is measured using $^1$H-NMR. The result is provided in FIG. 1.

Figure 2:
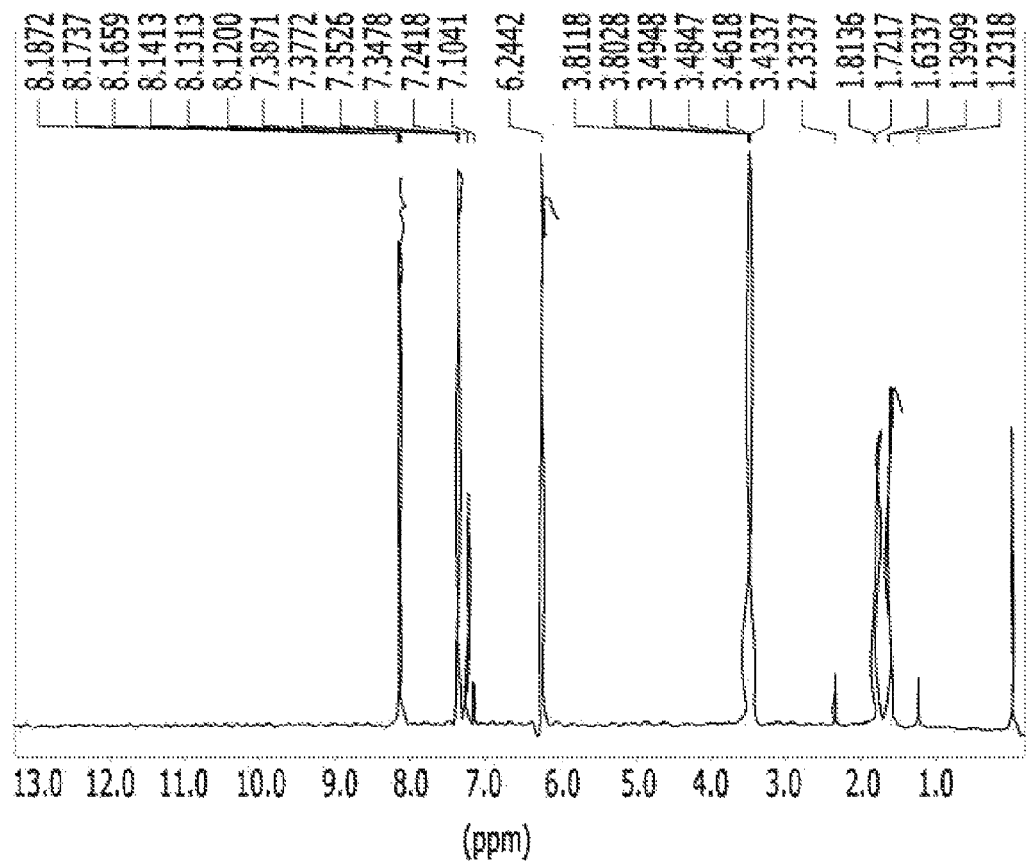
FIG. 2 is a graph showing $^1$H-NMR of 4-nadimido benzoyl chloride (EC-1) prepared in Synthesis Example 23.
Figure 3:
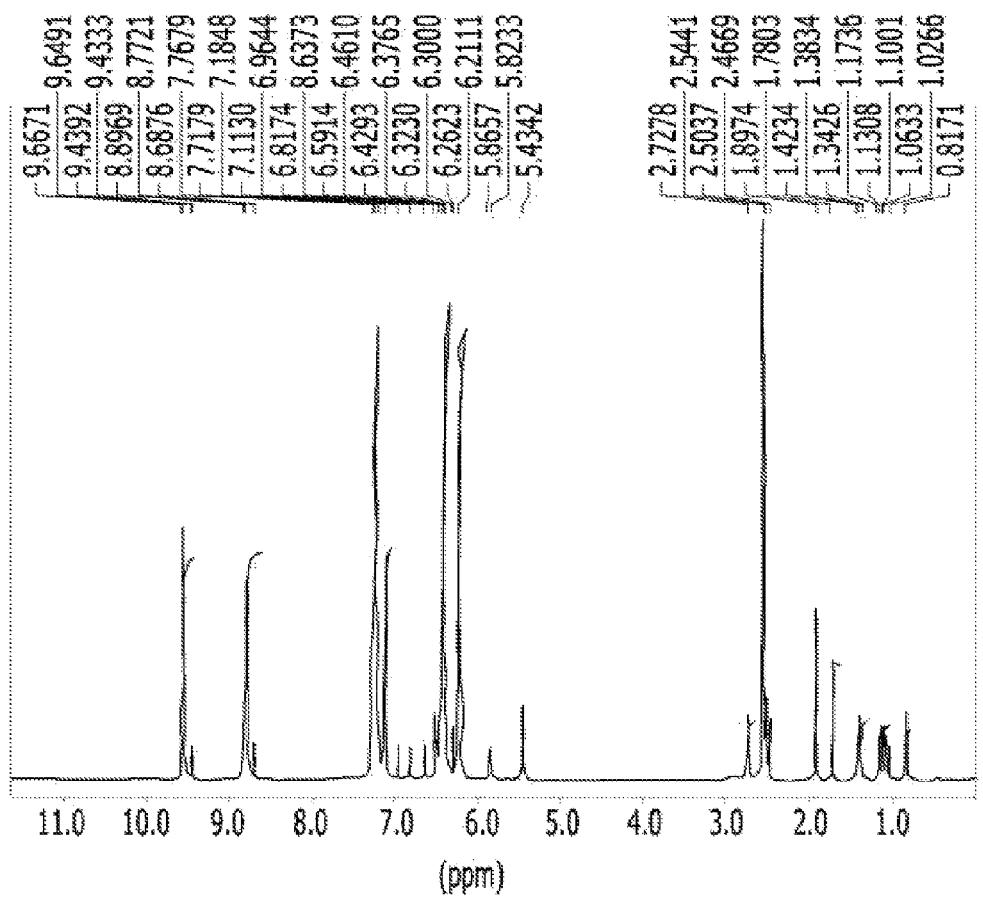
FIG. 3 is a graph showing $^1$H-NMR of polybenzoxazole precursor (PA-1) prepared in Polymerization Example 1.

The solid is put in a 4-necked flask having an agitator, a temperature controller, a nitrogen gas injector, and a cooler while nitrogen is passed therethrough, and 50 g of thionyl chloride is added thereto. The temperature of this solution is increased until the thionyl chloride is refluxed and then, further agitated for 4 hours. Then, the solution is cooled down to room temperature, and the thionyl chloride is all removed under vacuum. The obtained white solid is washed five times with toluene and then, heated and dried at 50° C. under vacuum for 12 hours, obtaining a 4-nadimido benzoylchloride end capping agent (EC-1). The 4-nadimido benzoylchloride is measured using $^1$H-NMR. The result was provided in FIG. 2.

Synthesis Example 24

4-(3-phenylethynylphthalimido)benzoylchloride (EC-2)

A 4-(2-phenylethynylphthalimido)benzoylchloride end capping agent (EC-2) is synthesized according to the same method as Synthesis Example 23 except for using 14.5 g of 3-phenylethynyl phthalic acid anhydride instead of 9.5 g of the 5-norbornene-2,3-dicarboxylic acidanhydride according to Synthesis Example 23.

Polymerization of Polybenzoxazole Precursor

Polymerization Example 1

PA-1

17.4 g of 2,2-bis(3-amino-4-hydroxyphenyl)-1,1,1,3,3,3,-hexafluoropropane and 0.86 g of 1,3-bis(aminopropyl)tetramethyldisiloxane are added to a 4-neck flask having an agitator, a temperature controller, a nitrogen gas injector, and a cooler while nitrogen is passed therethrough, and 280 g of N-methyl-2-pyrrolidone (NMP) is added thereto to dissolve them. Herein, the solution has a solid content of 9 wt %.

When the solid is completely dissolved, 9.9 g of pyridine is added thereto. White the mixture is maintained at a temperature ranging from 0° C. to 5° C., a solution prepared by dissolving 13.3 g of 4,4'-dioxybenzoylchloride in 142 g of N-methyl-2-pyrrolidone (NMP) is slowly added thereto in a dropwise fashion for 30 minutes. The mixture is reacted for 1 hour at a temperature ranging from 0° C. to 5° C. Then, the temperature of the reactant is increased up to 25° C., and the reactant is reacted for one hour.

Next, 1.6 g of the end capping agent (EC-1) synthesized according to Synthesis Example 23 is added to the reactant, and the reactant is agitated at 70° C. for 24 hours, completing the reaction. The mixture reactant is added to a solution prepared by mixing water/methanol in a volume ratio of 10/1 to obtain a precipitate. The precipitate is filtered, sufficiently cleaned with water, and dried at 80° C. under vacuum for greater than or equal to 24 hours, polymerizing a polybenzoxazole precursor (PA-1).

Polymerization Example 2

PA-2

A polybenzoxazole precursor (PA-2) is polymerized according to the same method as Polymerization Example 1 except for using an end capping agent (EC-2) synthesized according to Synthesis Example 24 instead of the end capping agent (EC-1) in Polymerization Example 1.

Preparation of Positive Photosensitive Resin Composition

Example 1

A positive photosensitive resin composition is prepared by dissolving 15 g of a polybenzoxazole precursor (PA-1) polymerized according to Polymerization Example 1 in 35.0 g of γ-butyrolactone (GBL), adding 3 g of a photosensitive novolac resin of mp91-500 according to Synthesis Example 11 and 0.75 g of trimethoxy[3-(phenylamino)propyl]silane (C) as a silane coupling agent thereto and dissolving them, and then, filtering the solution with 0.45 μm of a fluorine resin.

Example 2

A positive photosensitive resin composition is prepared according to the same method as Example 1 except for using 15 g of a polybenzoxazole precursor (PA-2) polymerized according to Polymerization Example 2 instead of PA-1 according to Example 1.

Example 3

A positive photosensitive resin composition is prepared according to the same method as Example 1 except for using mp91-2000 according to Synthesis Example 12 instead of mp91-500 according to Example 1.

Example 4

A positive photosensitive resin composition is prepared according to the same method as Example 2 except for using mp91-2000 according to Synthesis Example 12 instead of mp91-500 according to Example 2.

Example 5

A positive photosensitive resin composition is prepared according to the same method as Example 1 except for using mp82-500 according to Synthesis Example 13 instead of mp91-500 according to Example 1.

Example 6

A positive photosensitive resin composition is prepared according to the same method as Example 2 except for using mp82-500 according to Synthesis Example 13 instead of mp91-500 according to Example 2.

Example 7

A positive photosensitive resin composition is prepared according to the same method as Example 2 except for using mp82-2000 according to Synthesis Example 14 instead of mp91-500 according to Example 2.

Example 8

A positive photosensitive resin composition is prepared according to the same method as Example 2 except for using mp82-2000 according to Synthesis Example 14 instead of mp91-500 according to Example 2.

Example 9

A positive photosensitive resin composition is prepared according to the same method as Example 1 except for using mp73-500 according to Synthesis Example 15 instead of mp91-500 according to Example 1.

Example 10

A positive photosensitive resin composition is prepared according to the same method as Example 2 except for using mp73-500 according to Synthesis Example 15 instead of mp91-500 according to Example 2.

Example 11

A positive photosensitive resin composition is prepared according to the same method as Example 1 except for using mp73-2000 according to Synthesis Example 16 instead of mp91-500 according to Example 1.

Example 12

A positive photosensitive resin composition is prepared according to the same method as Example 2 except for using mp73-2000 according to Synthesis Example 16 instead of mp91-500 according to Example 2.

Comparative Example 1

A positive photosensitive resin composition is prepared according to the same method as Example 1 except for using photosensitive diazoquinone represented by the above Chemical Formula 50 (hydroxy-4-(4-hydroxy-2,5-dimethyl-benzyl)benzenenaphtoquinonediazide sulfonic acid according to Synthesis Example 22) instead of mp91-500 according to Example 1.

Comparative Example 2

A positive photosensitive resin composition is prepared according to the same method as Example 2 except for using photosensitive diazoquinone represented by the above Chemical Formula 50 (hydroxy-4-(4-hydroxy-2,5-dimethyl-benzyl)benzenenaphtoquinonediazide sulfonic acid according to Synthesis Example 22) instead of mp91-500 according to Example 2.

Comparative Example 3

A positive photosensitive resin composition is prepared according to the same method as Example 1 except for using mp55-500 according to Synthesis Example 17 instead of mp91-500 according to Example 1.

Comparative Example 4

A positive photosensitive resin composition is prepared according to the same method as Example 2 except for using mp55-500 according to Synthesis Example 17 instead of mp91-500 according to Example 2.

Comparative Example 5

A positive photosensitive resin composition is prepared according to the same method as Example 1 except for using mp55-2000 according to Synthesis Example 18 instead of mp91-500 according to Example 1.

Comparative Example 6

A positive photosensitive resin composition is prepared according to the same method as Example 2 except for using mp55-2000 according to Synthesis Example 18 instead of mp91-500 according to Example 2.

Comparative Example 7

A positive photosensitive resin composition is prepared according to the same method as Example 1 except for using mp46-500 according to Synthesis Example 19 instead of mp91-500 according to Example 1.

Comparative Example 8

A positive photosensitive resin composition is prepared according to the same method as Example 2 except for using mp46-500 according to Synthesis Example 19 instead of mp91-500 according to Example 2.

Comparative Example 9

A positive photosensitive resin composition is prepared according to the same method as Example 1 except for using mp46-2000 according to Synthesis Example 20 instead of mp91-500 according to Example 1.

Comparative Example 10

A positive photosensitive resin composition is prepared according to the same method as Example 2 except for using mp46-2000 according to Synthesis Example 20 instead of mp91-500 according to Example 2.

Evaluation 1

Film Residue Ratio

The positive photosensitive resin compositions according to Examples 1 to 12 and Comparative Examples 1 to 10, respectively, are coated on an 8 inch wafer using a (1H-DX2) spin-coater made by Mikasa Co., Ltd. and heated on a 120° C. hot plate for 4 minutes, forming a positive photosensitive resin composition film.

The positive photosensitive resin film is exposed at 250 ms with a I-line stepper (NSR i10C) made by Nikon Co. using a mask having variously-sized patterns, and the exposed part is dissolved and removed using a 2.38 wt % tetramethylammonium hydroxide aqueous solution at room temperature for 60 seconds (2 puddles) and cleaned with pure water for 30 seconds. Then, the obtained pattern is cured in an oxygen concentration of less than or equal to 1000 ppm at 150° C./30 minutes and additionally, at 320° C./30 minutes, fabricating a film having a pattern.

Then, the film residue ratio (thickness after the development/thickness before the development, unit [%]) is calculated by measuring thicknesses of the film before and after the development, since the film should have minimal reduction in film thickness, which may have an influence on developability and final film thickness. The results are provided in the following Table 1. The film thickness change after the curing is measured by measuring a coating thickness with ST4000-DLX made by K-MAC.

Evaluation 2

Sensitivity

Sensitivity is evaluated by exposing and developing the film and then measuring the exposure dose of a 10 μm L/S pattern with a 1:1 line width and referring the exposure dose to optimal exposure energy. Herein, less optimal exposure energy is regarded to be excellent sensitivity. The results are provided in the following Table 1.

TABLE 1

| | Poly-benzoxazole precursor | Photosensitive diazoquinone | | Film residue ratio (%) | Sensitivity (mJ/cm$^2$) |
|---|---|---|---|---|---|
| | | m-cresol: p-cresol weight ratio | weight average molecular weight | | |
| Example1 | PA-1 | 90:10 | 500 | 86 | 120 |
| Example2 | PA-2 | 90:10 | 500 | 84 | 140 |
| Example3 | PA-1 | 90:10 | 2000 | 92 | 160 |
| Example4 | PA-2 | 90:10 | 2000 | 91 | 150 |
| Example5 | PA-1 | 80:20 | 500 | 88 | 170 |
| Example6 | PA-2 | 80:20 | 500 | 87 | 170 |
| Example7 | PA-1 | 80:20 | 2000 | 93 | 130 |
| Example8 | PA-2 | 80:20 | 2000 | 94 | 130 |
| Example9 | PA-1 | 70:30 | 500 | 90 | 185 |
| Example10 | PA-2 | 70:30 | 500 | 91 | 190 |
| Example11 | PA-1 | 70:30 | 2000 | 96 | 150 |
| Example12 | PA-2 | 70:30 | 2000 | 95 | 140 |
| Comparative Example 1 | PA-1 | hydroxy-4-(4-hydroxy-2,5-dimethyl benzyl)benzene naphto quinone diazide sulfonic acid | | 81 | 410 |
| Comparative Example 2 | PA-2 | | | 78 | 380 |
| Comparative Example 3 | PA-1 | 50:50 | 500 | 85 | 350 |
| Comparative Example 4 | PA-2 | 50:50 | 500 | 86 | 460 |
| Comparative Example 5 | PA-1 | 50:50 | 2000 | 78 | 400 |
| Comparative Example 6 | PA-2 | 50:50 | 2000 | 81 | 360 |
| Comparative Example 7 | PA-1 | 40:60 | 500 | 80 | 500 |
| Comparative Example 8 | PA-2 | 40:60 | 500 | 86 | 470 |
| Comparative Example 9 | PA-1 | 40:60 | 2000 | 87 | 460 |
| Comparative Example 10 | PA-2 | 40:60 | 2000 | 80 | 380 |

As shown in Table 1, the positive photosensitive resin composition according to Examples 1 to 12 have a higher film residue ratio than the ones according to Comparative Examples 1 to 10. In addition, the positive photosensitive resin compositions according to Examples 1 to 12 have excellent sensitivity compared with the ones according to Comparative Examples 1 to 10. In other words, since a pattern is sufficiently formed with smaller energy, it may take less time to form the pattern, which can provide an excellent process margin.

In general, a film having a high film residue ratio tends to have worse sensitivity. However, the photosensitive novolac resin including almost no phenolic hydroxy group or carboxyl group capable of being dissolved in an alkali aqueous solution is remarkably suppressed from dissolution in the unexposed part. In the exposed part, quinone diazide is decomposed by a light and produces carboxylic acid per unit of novolac, which causes the exposed part to dissolve in a developing solution faster than a conventional one.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A positive photosensitive resin composition comprising:
   (A) a polybenzoxazole precursor including a structural unit represented by the following Chemical Formula 3, a structural unit represented by the following Chemical Formula 4, or a combination thereof;
   (B) a photosensitive novolac resin comprising a structural unit represented by the following Chemical Formula 1 and a structural unit represented by the following Chemical Formula 2; and (C) a solvent:

[Chemical Formula 3]

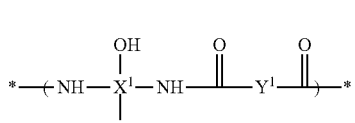

[Chemical Formula 4]

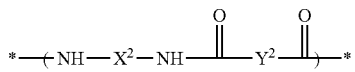

wherein, in Chemical Formulae 3 and 4, $X^1$ is independently a substituted or unsubstituted C6 to C30 aromatic organic group or a substituted or unsubstituted C1 to C30 alicyclic organic group, $X^2$ is independently a substituted or unsubstituted C6 to C30 aromatic organic group, a substituted or unsubstituted C3 to C30 alicyclic organic group, or a functional group represented by the following Chemical Formula 5, $Y^1$ and $Y^2$ are the same or different and are independently a substituted or unsubstituted C6 to C30 aromatic organic group or a substituted or unsubstituted C3 to C30 alicyclic organic group, and when the mol % of the structural unit of Chemical Formula 3 is m, and the mol % of the structural unit of Chemical Formula 4 is n in the polybenzoxazole precursor, and m+n is 100 mol %, m ranges from about 60 mol % to about 95 mol %, and n ranges from about 5 mol % to about 40 mol %,

[Chemical Formula 5]

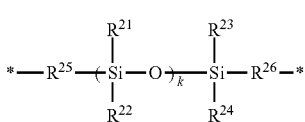

wherein, in Chemical Formula 5, $R^{21}$ to $R^{24}$ are the same or different and are independently hydrogen, substituted or unsubstituted C1 to C30 alkyl, substituted or unsubstituted C6 to C30 aryl, substituted or unsubstituted C1 to C30 alkoxy, or hydroxy, $R^{25}$ to $R^{26}$ are the same or different and are independently a single bond, substituted or unsubstituted C1 to C30 alkylene, or substituted or unsubstituted C6 to C30 arylene, and k is an integer ranging from 1 to 50,

[Chemical Formula 1]

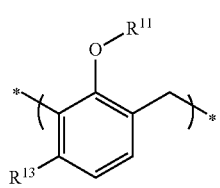

[Chemical Formula 2]

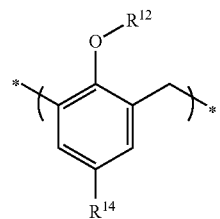

wherein, in Chemical Formulae 1 and 2, $R^{11}$ and $R^{12}$ are the same or different and are independently hydrogen or a quinone diazide sulfonyl group, wherein 50% or more of $R^{11}$ and $R^{12}$ in the photosensitive novolac resin is a quinone diazide sulfonyl group, $R^{13}$ and $R^{14}$ are the same or different and are independently C1 to C7 alkyl, and when the number of the structural unit of Chemical Formula 1 is x, and the number of the structural unit of Chemical Formula 2 is y in the photosensitive novolac resin, x+y ranges from about 2 to about 30, and x/(x+y) ranges from about 0.6 to about 0.95.

2. The positive photosensitive resin composition of claim 1, wherein the polybenzoxazole precursor has a weight average molecular weight (Mw) of about 3,000 to about 300,000.

3. The positive photosensitive resin composition of claim 1, wherein the positive photosensitive resin composition comprises:
about 5 parts by weight to about 150 parts by weight of the photosensitive novolac resin (B); and
a balance amount of the solvent (C), based on about 100 parts by weight of the polybenzoxazole precursor (A).

4. The positive photosensitive resin composition of claim 1, wherein the positive photosensitive resin composition further comprises about 0.1 parts by weight to about 30 parts by weight of a silane compound based on about 100 parts by weight of the polybenzoxazole precursor.

5. A photosensitive resin film fabricated by using the positive photosensitive resin composition according to claim 1.

6. A semiconductor device comprising the photosensitive resin film according to claim 5.

7. The positive photosensitive resin composition of claim 1, wherein the photosensitive novolac resin has a weight average molecular weight (Mw) of about 500 to about 15,000.

8. The positive photosensitive resin composition of claim 1, wherein the quinone diazide sulfonyl group of the photosensitive novolac resin comprises a 1,2-naphthoquinone diazide-4-sulfonyl group represented by the following Chemical Formula 6, a 1,2-naphthoquinone diazide-5-sulfonyl group represented by the following Chemical Formula 7, a 1,2-benzoquinone diazide-4-sulfonyl group represented by the following Chemical Formula 8, or a combination thereof:

[Chemical Formula 6]

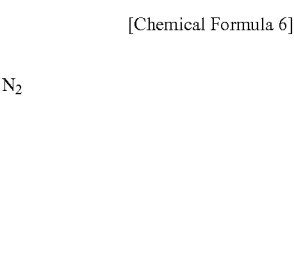

[Chemical Formula 7]
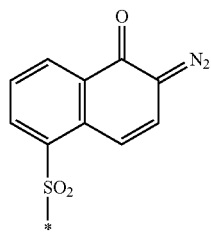
[Chemical Formula 8]
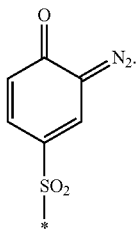
* * * * *

UNITED STATES PATENT AND TRADEMARK OFFICE
CERTIFICATE OF CORRECTION

PATENT NO. : 8,785,103 B2
APPLICATION NO. : 13/590440
DATED : July 22, 2014
INVENTOR(S) : Jong-Hwa Lee et al.

It is certified that error appears in the above-identified patent and that said Letters Patent is hereby corrected as shown below:

In the Specification

Column 12, Line 42 reads: "O, CO, $SO_2$, S, or a single bond, wherein $R^{205}$ and"
and should read: "O, CO, $CR^{205}R^{206}$, $SO_2$, S, or a single bond, wherein $R^{205}$ and"

Column 12, Line 52 reads: "$n_5$, $n_6$, and $n_g$ are the same or different and are indepen-"
and should read: "$n_5$, $n_6$, $n_8$, and $n_g$ are the same or different and are indepen-"

Column 23, Line 3 reads: "obtained wet cake is agitated and washed with of ion"
and should read: "obtained wet cake is agitated and washed with 350g of ion"

Signed and Sealed this
Sixteenth Day of December, 2014

Michelle K. Lee
*Deputy Director of the United States Patent and Trademark Office*

UNITED STATES PATENT AND TRADEMARK OFFICE
CERTIFICATE OF CORRECTION

Page 1 of 1

PATENT NO. : 8,785,103 B2
APPLICATION NO. : 13/590440
DATED : July 22, 2014
INVENTOR(S) : Jong-Hwa Lee et al.

It is certified that error appears in the above-identified patent and that said Letters Patent is hereby corrected as shown below:

In the Specification

Column 12, Line 42 reads: "O, CO, $CR^{206}R^{206}$ $SO_2$, S, or a single bond, wherein $R^{205}$ and"
and should read: "O, CO, $CR^{205}R^{206}$, $SO_2$, S, or a single bond, wherein $R^{205}$ and"

Column 12, Line 52 reads: "$n_5$, $n_6$, and $n_g$ are the same or different and are indepen-"
and should read: "$n_5$, $n_6$, $n_8$, and $n_g$ are the same or different and are indepen-"

Column 23, Line 3 reads: "obtained wet cake is agitated and washed with of 35 g ion"
and should read: "obtained wet cake is agitated and washed with 350g of ion"

This certificate supersedes the Certificate of Correction issued December 16, 2014.

Signed and Sealed this
Seventeenth Day of February, 2015

Michelle K. Lee
*Deputy Director of the United States Patent and Trademark Office*